United States Patent
Wilmering et al.

(10) Patent No.: US 11,776,330 B2
(45) Date of Patent: *Oct. 3, 2023

(54) CLOSED-LOOP DIAGNOSTIC MODEL MATURATION FOR COMPLEX SYSTEMS

(71) Applicant: The Boeing Company, Chicago, IL (US)

(72) Inventors: Timothy J. Wilmering, Chesterfield, MO (US); Stanley C. Ofsthun, O'Fallon, MO (US); Seema Chopra, Bengaluru (IN); Nazrul Bayen, Bengaluru (IN); Rohit Kumar, Bengaluru (IN); Gurpreet Singh, Bengaluru (IN)

(73) Assignee: The Boeing Company, Chicago, IL (US)

( * ) Notice: Subject to any disclaimer, the term of this patent is extended or adjusted under 35 U.S.C. 154(b) by 273 days.

This patent is subject to a terminal disclaimer.

(21) Appl. No.: 17/027,890

(22) Filed: Sep. 22, 2020

(65) Prior Publication Data

US 2021/0174612 A1 Jun. 10, 2021

Related U.S. Application Data

(60) Provisional application No. 62/922,231, filed on Dec. 9, 2019.

(51) Int. Cl.
*G07C 5/08* (2006.01)
*G07C 5/00* (2006.01)
(Continued)

(52) U.S. Cl.
CPC ........... *G07C 5/0808* (2013.01); *B64D 45/00* (2013.01); *B64F 5/60* (2017.01); *G06F 30/27* (2020.01);
(Continued)

(58) Field of Classification Search
None
See application file for complete search history.

(56) References Cited

U.S. PATENT DOCUMENTS 5,544,308 A * 8/1996 Giordano ............ G06F 11/2257
706/912
5,919,267 A * 7/1999 Urnes .................. G06N 3/0454
714/E11.026

(Continued)

FOREIGN PATENT DOCUMENTS

EP 2 323 005 A1 5/2011
EP 2 876 519 A2 5/2015

OTHER PUBLICATIONS

Extended European Search Report dated Mar. 24, 2021 in the corresponding European Application No. 20203701.6.

*Primary Examiner* — Abdhesh K Jha
(74) *Attorney, Agent, or Firm* — Quinn IP Law

(57) ABSTRACT

A method is provided for maintaining an onboard reasoner for diagnosing failures on an aircraft that includes aircraft systems configured to report faults to the onboard reasoner. The method includes accessing diagnostic data received from an onboard computer of the aircraft that includes the onboard reasoner. An off-board reasoner builds an off-board diagnostic causal model that describes causal relationships between the failed tests and the diagnosed failure modes. The off-board diagnostic causal model is compared to the diagnostic data. Based thereon, a discrepancy is identified between the graph of the off-board diagnostic causal model, and the other graph of the onboard diagnostic causal model, to determine a new causal relationship relative to the known causal relationships. The onboard diagnostic causal model is updated to further describe the new causal relationship, including producing an updated model, and uploading the updated model to the onboard computer.

18 Claims, 11 Drawing Sheets

(51) Int. Cl.
*B64F 5/60* (2017.01)
*B64D 45/00* (2006.01)
*G06F 30/27* (2020.01)

(52) U.S. Cl.
CPC ...... *G07C 5/008* (2013.01); *B64D 2045/0085* (2013.01)

(56) References Cited

U.S. PATENT DOCUMENTS

| | | | |
|---|---|---|---|
| 6,240,343 B1 * | 5/2001 | Sarangapani | G01M 15/05 73/114.61 |
| 2006/0047454 A1 * | 3/2006 | Tamaki | G06Q 10/06 702/84 |
| 2008/0040152 A1 | 2/2008 | Vian et al. | |
| 2011/0087387 A1 | 4/2011 | Safa-Bakhsh et al. | |
| 2014/0067695 A1 | 3/2014 | Black et al. | |
| 2015/0185128 A1 | 7/2015 | Chang et al. | |
| 2015/0242472 A1 | 8/2015 | Kasik et al. | |
| 2015/0375870 A1 | 12/2015 | Poisson, Jr. et al. | |
| 2016/0034858 A1 | 2/2016 | Avery et al. | |
| 2016/0321594 A1 * | 11/2016 | Linde | G06F 11/008 |
| 2018/0307219 A1 | 10/2018 | Horiwaki et al. | |

* cited by examiner

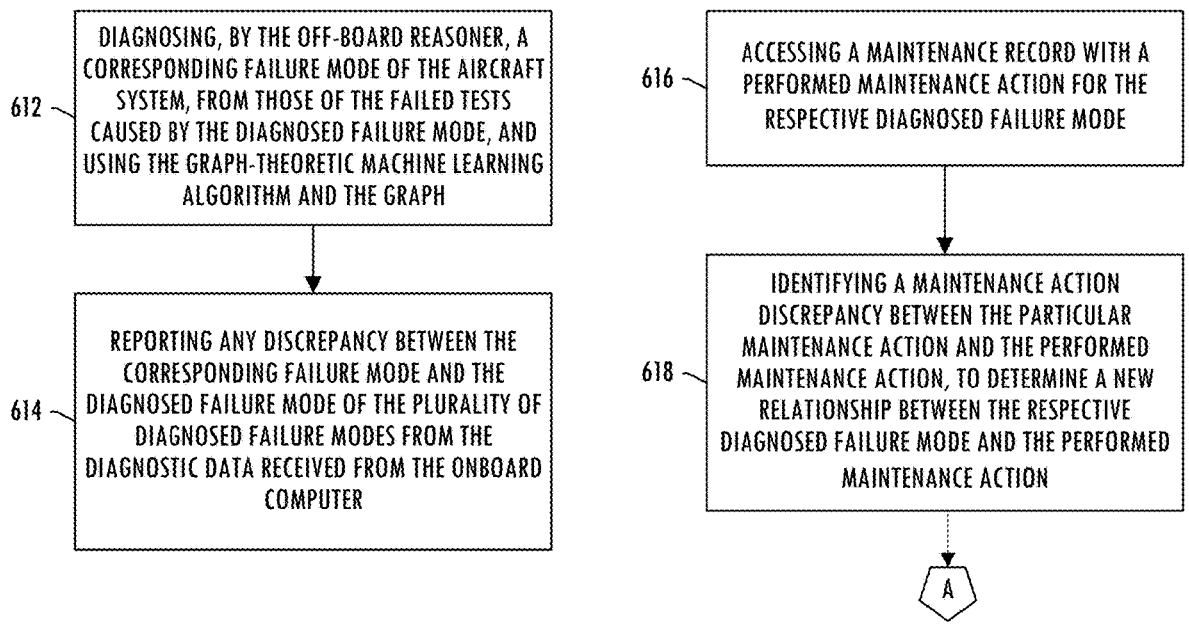

CLOSED-LOOP DIAGNOSTIC MODEL MATURATION FOR COMPLEX SYSTEMS

CROSS REFERENCE OF RELATED APPLICATION

This application claims priority to U.S. Provisional Application No. 62/922,231, filed Dec. 9, 2019, entitled Closed-Loop Diagnostic Model Maturation for Complex Systems, the content of which is incorporated herein by reference in its entirety.

TECHNOLOGICAL FIELD

The present disclosure relates generally to aircraft maintenance and, in particular, to onboard diagnosis of an aircraft system failure mode and related aircraft maintenance.

BACKGROUND

Complex systems such as machines including vehicles such as aircraft, spacecraft, watercraft, motor vehicles, railed vehicles, typically include some type of performance monitoring system that records data regarding the machine performance, which includes the performance of the various systems (and subsystems) of the machine. The data include a record of certain performance events that occur during the operation of the machine. The performance monitoring system typically conducts data collection and reports all of the data collected to the user. The user then may utilize the data in determining the type of maintenance or repair, if any, that the machine may need. For example, if the data indicates that a particular mechanical or electromechanical system of the machine is malfunctioning or that the performance of one or more mechanical or electromechanical systems may contribute to a future machine failure, then the user can perform the appropriate repair on the machine at the next opportunity.

While the current systems for machine performance and fault monitoring provide the necessary data for a user to make an appropriate repair decision, it is still necessary for a user to sort through all of the data to determine the most-appropriate repair action to address a fault mode. Thus, the user must sort and interpret the data in light of the user's knowledge of the particular machine. This can be time consuming and not always result in the first performed repair action being the most appropriate repair action, particularly for complex machines like aircraft and other vehicles. For many types of machines, particularly commercial vehicles, the amount of time the vehicle is out of service is costly to the vehicle owner. As such, the longer it takes for the most-appropriate repair action to be performed for a given fault mode, the longer the vehicle will be out of service, which may be expensive to the vehicle owner if the vehicle would otherwise be in service.

Therefore, it would be desirable to have a system and method that takes into account at least some of the issues discussed above, as well as other possible issues.

BRIEF SUMMARY

Example implementations of the present disclosure are directed to improved techniques for onboard diagnosis and correlation of failure data to maintenance actions, and closed-loop diagnostic model maturation for complex systems. Example implementations provide an onboard reasoner on an aircraft and a process for diagnosing a failure on the aircraft. Other example implementations provide an off-board reasoner and a process for closed-loop diagnostic model maturation in order to maintain the onboard reasoner for diagnosing failures on the aircraft.

The present disclosure thus includes, without limitation, the following example implementations.

Some example implementations provide a method of diagnosing a failure on an aircraft that includes aircraft systems configured to report faults to an onboard reasoner, the method comprising: receiving a fault report at an onboard computer of the aircraft that includes the onboard reasoner, from an aircraft system of the aircraft systems, the fault report indicating failed tests reported by the aircraft system; accessing, by the onboard reasoner, an onboard diagnostic causal model represented by a graph that describes known causal relationships between possible failed tests reported by the respective ones of the aircraft systems, and possible failure modes of the respective ones of the aircraft systems; diagnosing, by the onboard reasoner, a failure mode of the aircraft system or another of the aircraft systems, from the failed tests, and using a graph-theoretic algorithm and the onboard diagnostic causal model; determining a maintenance action for the failure mode; and generating, by the onboard computer, a maintenance message including at least the maintenance action.

In some example implementations of the method of any preceding example implementation, or any combination of any preceding example implementations, the onboard diagnostic causal model is represented by the graph that includes nodes connected by edges, the nodes representing the possible failed tests and the possible failure modes, and the edges indicating the known causal relationships between the possible failed tests and the possible failure modes.

In some example implementations of the method of any preceding example implementation, or any combination of any preceding example implementations, the onboard diagnostic causal model is represented by the graph that is an assembly of graphs for respective ones of the aircraft systems, the graphs reflecting fault propagation behavior within the respective ones of the aircraft systems, and the assembly reflecting fault propagation behavior across connected ones of the aircraft systems.

In some example implementations of the method of any preceding example implementation, or any combination of any preceding example implementations, the graph-theoretic algorithm is an optimal solution set (OSS) algorithm.

In some example implementations of the method of any preceding example implementation, or any combination of any preceding example implementations, the method further comprises sending the maintenance message to a display device onboard the aircraft, or a display device on a maintenance component configured to establish a connection with the onboard computer to receive the maintenance message.

In some example implementations of the method of any preceding example implementation, or any combination of any preceding example implementations, display of the maintenance message references instructions for performing the maintenance action to address the failure mode diagnosed by the onboard reasoner.

In some example implementations of the method of any preceding example implementation, or any combination of any preceding example implementations, the fault report is one of a plurality of fault reports of failed tests reported by respective ones of the aircraft systems, the failure mode is one of a plurality of diagnosed failure modes of at least some of the aircraft systems that caused the failed tests, and the method further comprises: accessing diagnostic data received from the onboard computer, the diagnostic data including the plurality of fault reports and the plurality of diagnosed failure modes; accessing, by an off-board reasoner, an off-board diagnostic causal model that describes causal relationships between the failed tests and the plurality of diagnosed failure modes, the off-board diagnostic causal model built using a graph-theoretic machine learning algorithm trained using historical diagnostic data; comparing the diagnostic data to off-board diagnostic causal model; and based thereon, determining a new causal relationship in the causal relationships described by the off-board diagnostic causal model that is new relative to the known causal relationships; and updating the onboard diagnostic causal model to further describe the new causal relationship, including producing an updated onboard diagnostic causal model, and uploading the updated onboard diagnostic causal model to the onboard computer using a loadable software airplane part upload tool set.

In some example implementations of the method of any preceding example implementation, or any combination of any preceding example implementations, the diagnostic data further includes maintenance messages with maintenance actions determined by the onboard reasoner for respective ones of the plurality of diagnosed failure modes, and the onboard diagnostic causal model further describes relationships between the possible failure modes and respective ones of the maintenance actions, and wherein for a particular maintenance message with a particular maintenance action for a respective diagnosed failure mode, the method further comprises: accessing a maintenance record with a performed maintenance action and thereby a new maintenance action for the respective diagnosed failure mode; and identifying a maintenance action discrepancy between the particular maintenance action and the performed (new) maintenance action, to determine a new relationship between the respective diagnosed failure mode and the performed maintenance action, wherein updating the onboard diagnostic causal model further includes updating the onboard diagnostic causal model to describe the new relationship between the respective diagnosed failure mode and the performed (new) maintenance action.

In some example implementations of the method of any preceding example implementation, or any combination of any preceding example implementations, the graph-theoretic machine learning algorithm is a graph-theoretic algorithm for finding maximal cliques.

Some example implementations provide an onboard computer for diagnosing a failure on an aircraft that includes aircraft systems configured to report faults to an onboard reasoner, the onboard computer comprising memory configured to store computer-readable program code including the onboard reasoner; and processing circuitry configured to access the memory and execute the computer-readable program code to cause the apparatus to at least perform the method of any preceding example implementation, or any combination of any preceding example implementations.

Some example implementations provide a system for diagnosing a failure on an aircraft that includes aircraft systems configured to report faults to an onboard reasoner, the system comprising an onboard computer including the onboard reasoner configured to perform the method of any preceding example implementation, or any combination of any preceding example implementations.

Some example implementations provide a method of maintaining an onboard reasoner for diagnosing failures on an aircraft that includes aircraft systems configured to report faults to the onboard reasoner, the method comprising: accessing diagnostic data received from an onboard computer of the aircraft that includes the onboard reasoner, the diagnostic data including a plurality of fault reports of failed tests reported by respective ones of the aircraft systems, and a plurality of diagnosed failure modes of at least some of the aircraft systems that caused the failed tests; building, using an off-board reasoner, an off-board diagnostic causal model that describes causal relationships between the failed tests and the plurality of diagnosed failure modes, the off-board diagnostic causal model built using a graph-theoretic machine learning algorithm trained using historical diagnostic data; comparing the diagnostic data to the off-board diagnostic causal model; and based thereon, determine a new causal relationship in the causal relationships described by the off-board diagnostic causal model that is new relative to the known causal relationships; and updating the onboard diagnostic causal model to further describe the new causal relationship, including producing an updated onboard diagnostic causal model, and uploading the updated onboard diagnostic causal model to the onboard computer using a loadable software airplane part upload tool set.

In some example implementations of the method of any preceding example implementation, or any combination of any preceding example implementations, the off-board diagnostic causal model is represented by a graph that includes nodes connected by edges, the nodes representing the failed tests and the plurality of diagnosed failure modes, and the edges indicating the known causal relationships between the failed tests and the plurality of diagnosed failure modes.

In some example implementations of the method of any preceding example implementation, or any combination of any preceding example implementations, the comparing of the diagnostic data to the off-board diagnostic causal model further comprises comparing to actual failure data, diagnostic data, and maintenance action data collected from an onboard aircraft system, which reflect actual causal relationships.

In some example implementations of the method of any preceding example implementation, or any combination of any preceding example implementations, the graph-theoretic machine learning algorithm is a graph-theoretic algorithm for finding maximal cliques.

In some example implementations of the method of any preceding example implementation, or any combination of any preceding example implementations, the plurality of fault reports include a fault report that indicates those of the failed tests caused by a diagnosed failure mode of the plurality of diagnosed failure modes, and the method further comprises: diagnosing, by the off-board reasoner, a corresponding failure mode of the aircraft system, from those of the failed tests caused by the diagnosed failure mode, and using the graph-theoretic machine learning algorithm and the graph; and reporting any discrepancy between the corresponding failure mode diagnosed by the off-board reasoner, and the diagnosed failure mode of the plurality of diagnosed failure modes from the diagnostic data received from the onboard computer.

In some example implementations of the method of any preceding example implementation, or any combination of any preceding example implementations, the diagnostic data further includes maintenance messages with maintenance actions determined by the onboard reasoner for respective ones of the plurality of diagnosed failure modes, and the onboard diagnostic causal model further describes relationships between the possible failure modes and respective ones of the maintenance actions, and wherein for a particular maintenance message with a particular maintenance action for a respective diagnosed failure mode, the method further comprises: accessing a maintenance record with a performed maintenance action and thereby a new maintenance action for the respective diagnosed failure mode; and identifying a maintenance action discrepancy between the particular maintenance action and the performed maintenance action, to determine a new relationship between the respective diagnosed failure mode and the performed maintenance action, wherein updating the onboard diagnostic causal model further includes updating the onboard diagnostic causal model to describe the new relationship between the respective diagnosed failure mode and the performed maintenance action.

In some example implementations of the method of any preceding example implementation, or any combination of any preceding example implementations, the method further comprises receiving a fault report at the onboard computer of the aircraft that includes the onboard reasoner, from an aircraft system of the aircraft systems, the fault report indicating failed tests reported by the aircraft system; accessing, by the onboard reasoner, the updated onboard diagnostic causal model; diagnosing, by the onboard reasoner, a failure mode of the aircraft system or another of the aircraft systems, from the failed tests, and using a graph-theoretic algorithm and the updated onboard diagnostic causal model; determining a maintenance action for the failure mode; and generating, by the onboard computer, a maintenance message including at least the maintenance action.

In some example implementations of the method of any preceding example implementation, or any combination of any preceding example implementations, the graph-theoretic algorithm is an optimal solution set (OSS) algorithm.

Some example implementations provide an off-board computer for maintaining an onboard reasoner for diagnosing failures on an aircraft that includes aircraft systems configured to report faults to the onboard reasoner, the off-board computer comprising memory configured to store computer-readable program code including an off-board reasoner; and processing circuitry configured to access the memory and execute the computer-readable program code to cause the off-board computer to at least perform the method of any preceding example implementation, or any combination of any preceding example implementations.

Some example implementations provide a system for maintaining an onboard reasoner for diagnosing failures on an aircraft that includes aircraft systems configured to report faults to the onboard reasoner, the system comprising an onboard computer including the onboard reasoner and an off-board computer including an off-board reasoner, the system components configured to perform the method of any preceding example implementation, or any combination of any preceding example implementations.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

Figure 5A:
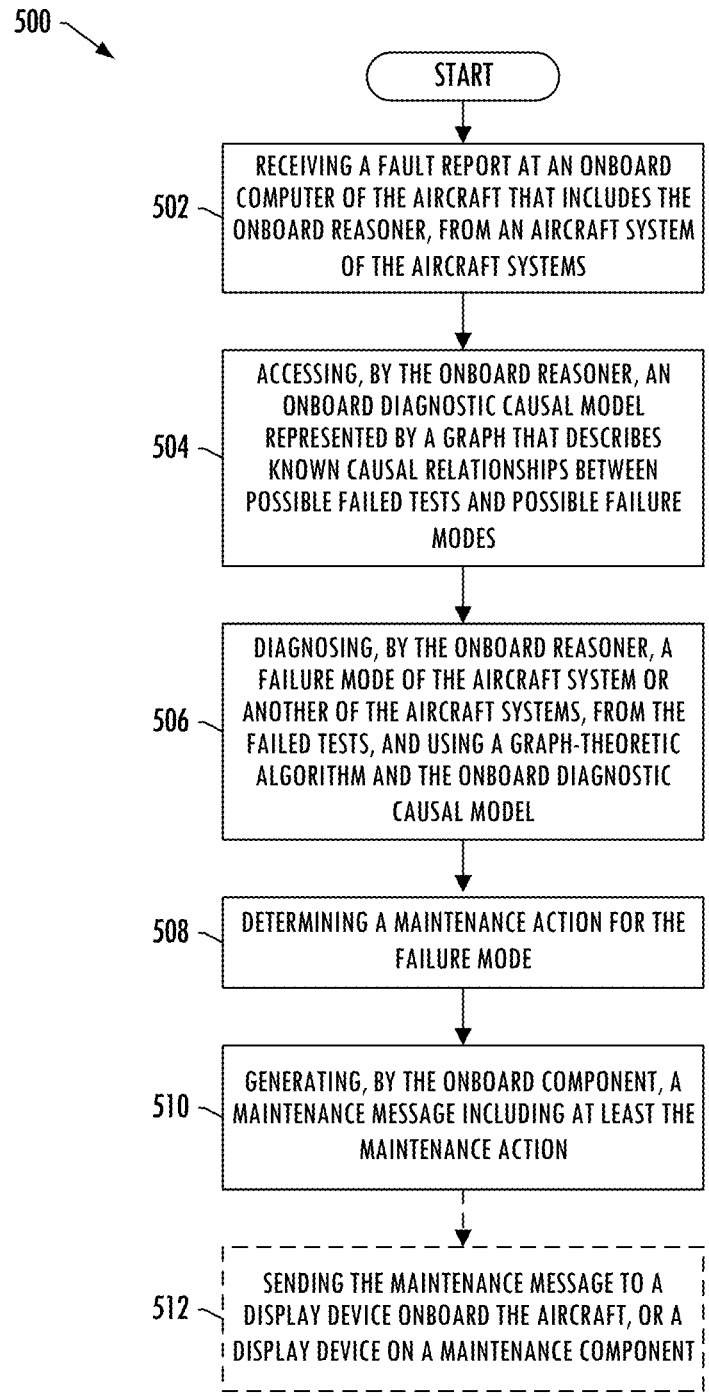
Figure 5B:
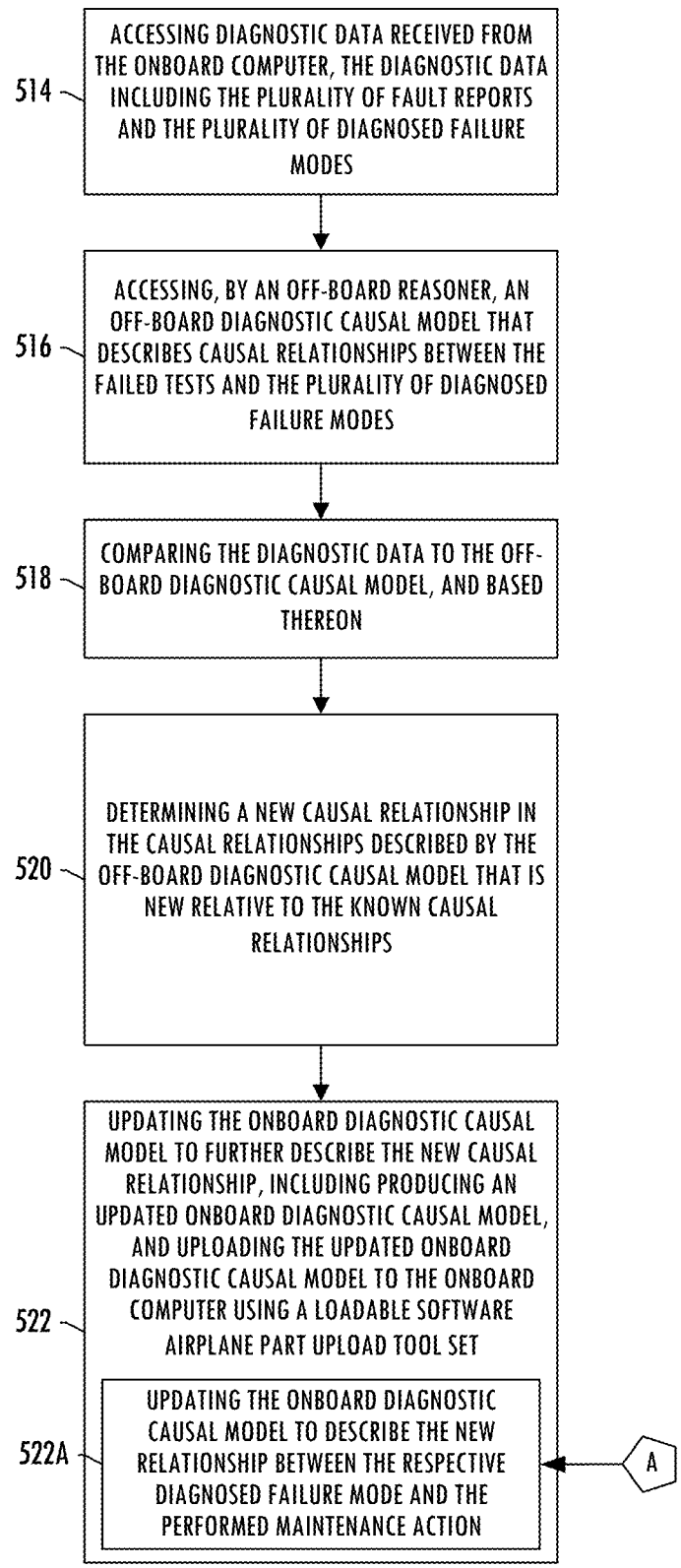
Figure 5C:
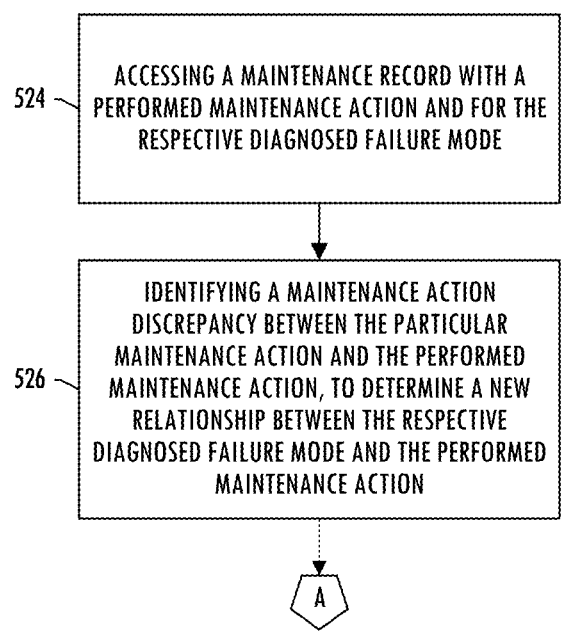
Figure 6A:
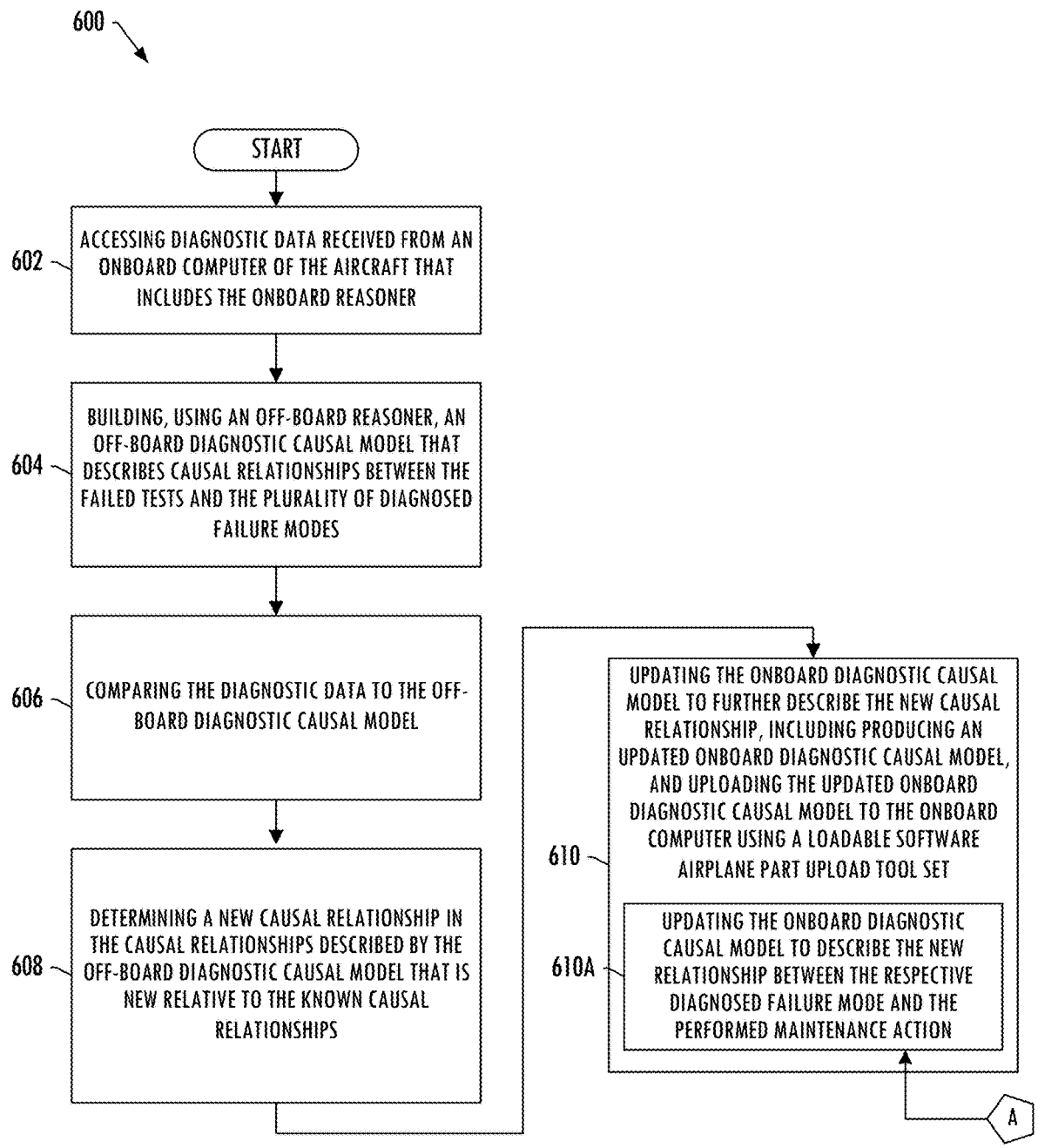
Figure 7:
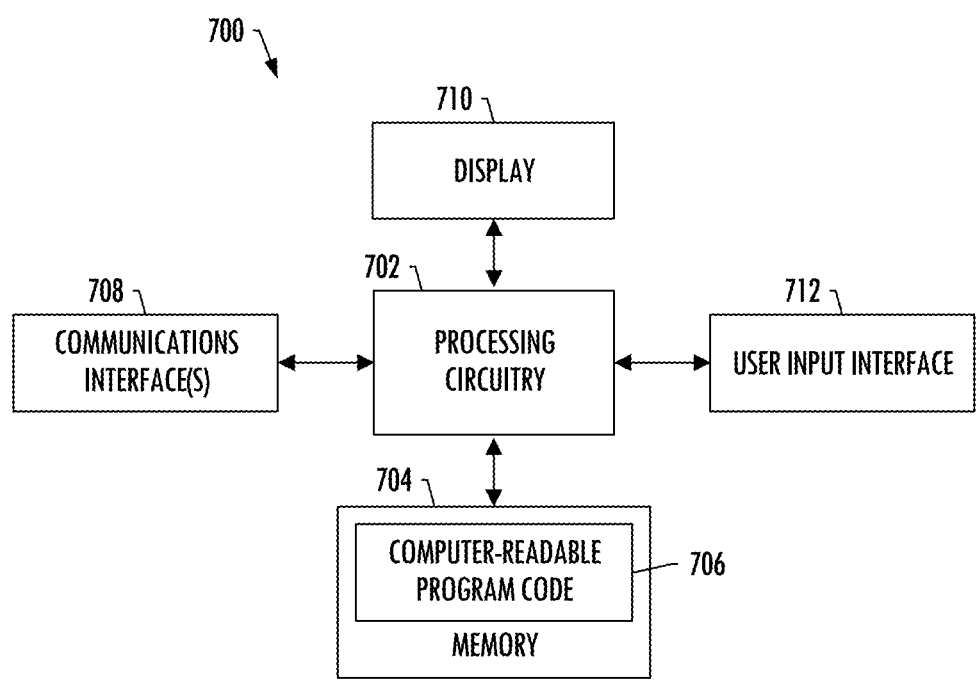

FIGS. 5A, 5B, and 5C are flowcharts illustrating various steps in a method of diagnosing a failure on an aircraft that includes aircraft systems configured to report faults to an onboard reasoner, according to example implementations;

FIGS. 6A, 6B, and 6C are flowcharts illustrating various steps in a method of maintaining an onboard reasoner for diagnosing failures on an aircraft that includes aircraft systems configured to report faults to the onboard reasoner, according to example implementations; and FIG. 7 illustrates an apparatus according to some example implementations.

DETAILED DESCRIPTION

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure are directed to improved techniques for onboard diagnosis and correlation of failure data to maintenance actions, and closed-loop diagnostic model maturation for complex system. Example implementations provide an onboard reasoner on an aircraft and a process for diagnosing a failure on the aircraft. Additionally or alternatively, some example implementations provide an off-board reasoner and a process for closed-loop diagnostic model maturation in order to maintain an onboard reasoner for diagnosing failures on the aircraft.

Figure 1:
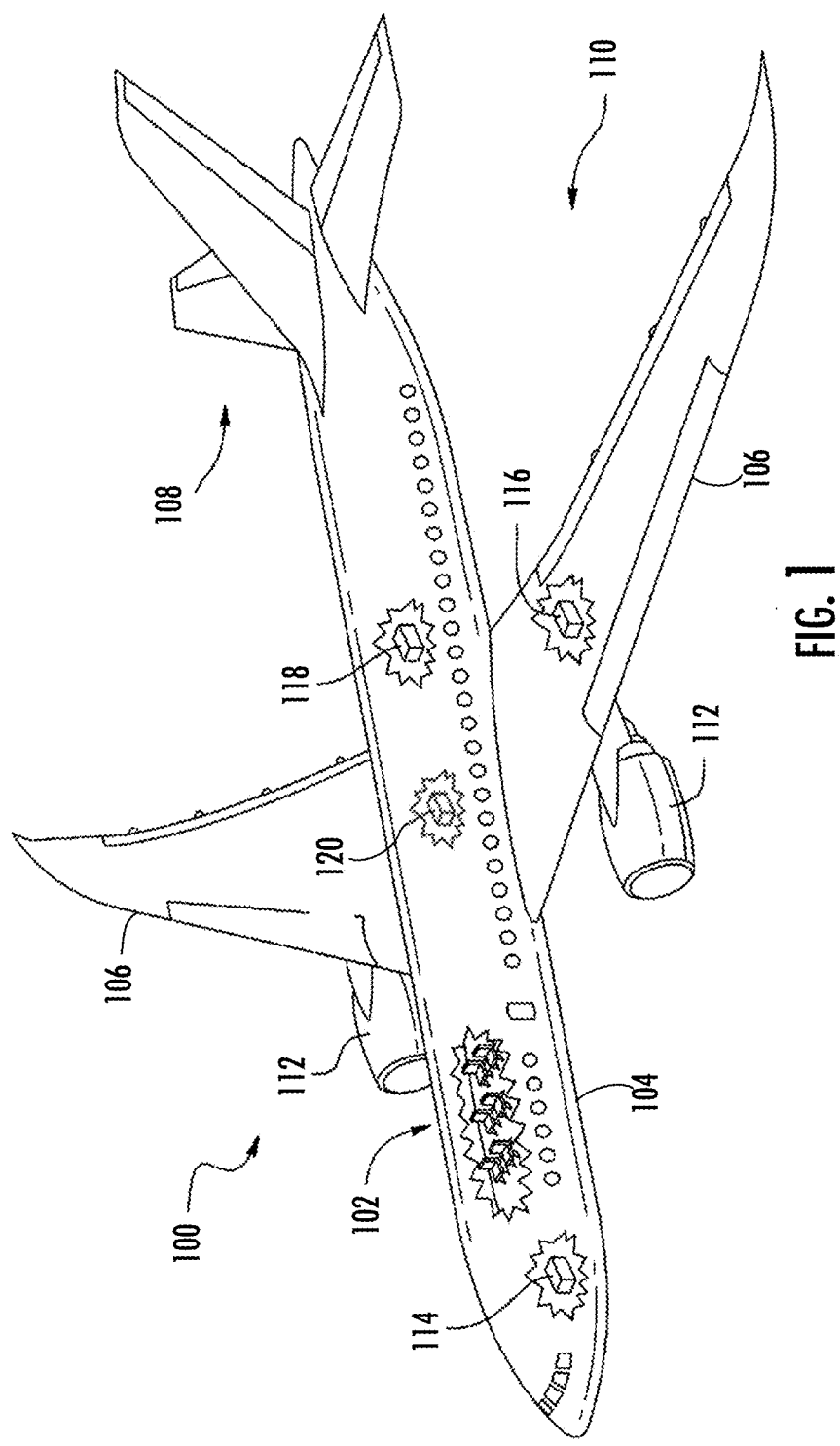
FIG. 1 illustrates an aircraft according to some example implementations of the present disclosure.

FIG. 1 illustrates one type of aircraft 100 that may benefit from example implementations of the present disclosure. As shown, the aircraft includes an airframe 102 with a fuselage 104, wings 106 and tail 108. The aircraft also includes a plurality of high-level systems 110 such as a propulsion system. In the particular example shown in FIG. 1, the propulsion system includes two wing-mounted engines 112. In other embodiments, the propulsion system can include other arrangements, for example, engines carried by other portions of the aircraft including the fuselage and/or the tail. The high-level systems may also include an electrical system 114, hydraulic system 116 and/or environmental system 118. Any number of other systems may be included.

The high-level systems described above may include a plurality of sensors and subsystems providing fault and sensor data that is communicated via an aircraft data communications bus network and/or an onboard network system (ONS) to an aircraft condition monitoring system (ACMS). The ACMS may collect, monitor, record and report real-time aircraft system data, which may include error messages from a flight deck effects (FDE) system, system test reports, fault reports and other information. The data collected by the ACMS is used, for example, to perform cabin pressure and temperature monitoring, hard landing detection, flight crew monitoring, and engine monitoring in addition to many other aircraft performance functions. The received data is then utilized to analyze aircraft performance, record significant flight events, report aircraft system test reports and fault reports, and troubleshoot faults.

The ACMS may be in communication with an onboard component/computer 120 which may also be referred to as a central maintenance computer (CMC), on which may reside an aircraft health management or maintenance management system and a diagnostic maintenance computing function (DMCF). The onboard computer 120 including the DMCF may receive aircraft system test reports and fault reports, and may further include an onboard diagnostic model. The DMCF may provide data acquisition for the onboard diagnostic model, which receives the test reports and fault report data.

Figure 2A:
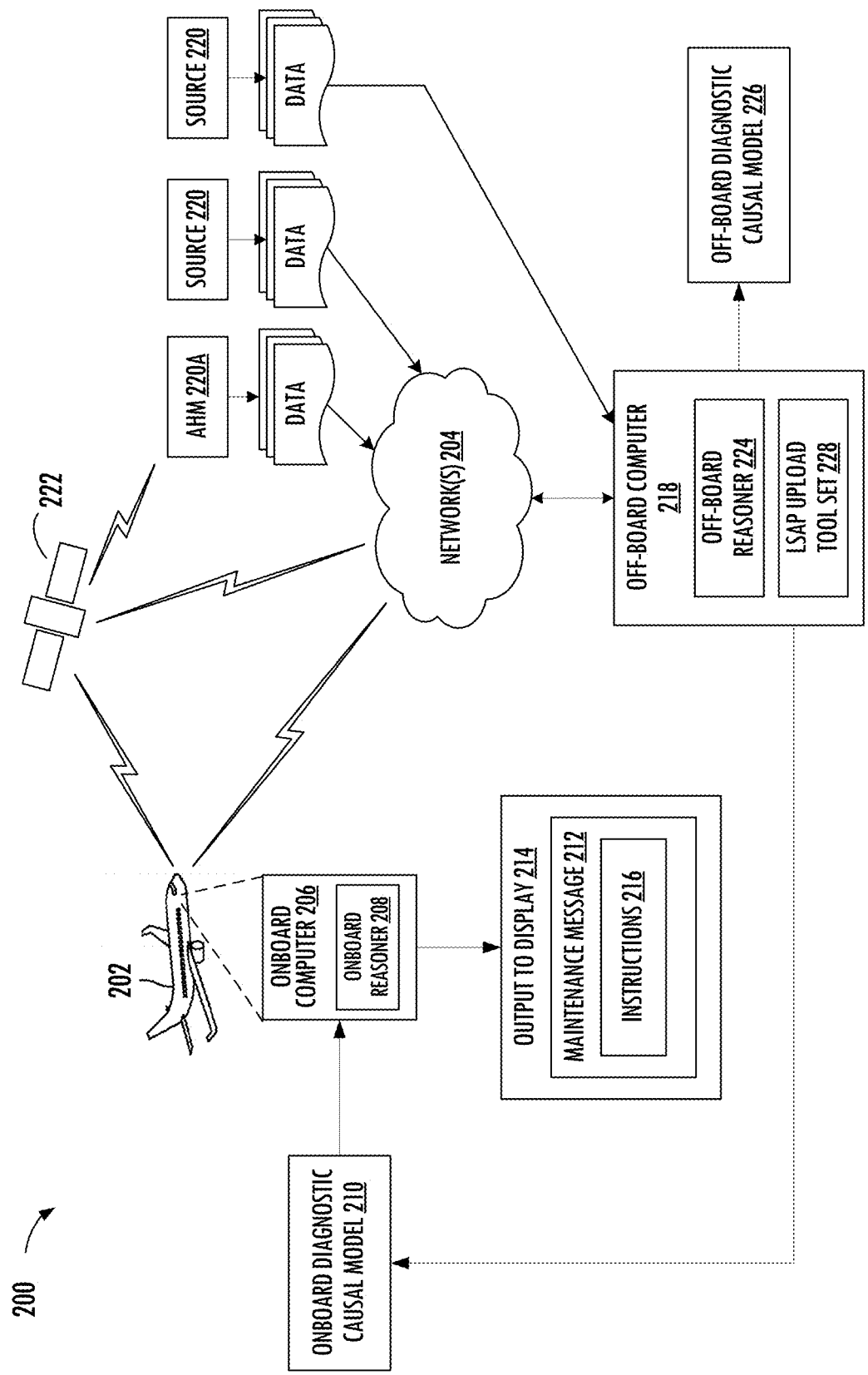
FIG. 2A illustrates a system for aircraft maintenance, according to example implementations of the present disclosure.

FIG. 2A illustrates a system 200 for maintenance of an aircraft 202 that may correspond to aircraft 100, according to some example implementations. As described in greater detail below, the system may include any of a number of different subsystems (each an individual system) for performing one or more functions or operations. The subsystems may be co-located or directly coupled to one another, or in some examples, various ones of the subsystems may communicate with one another across the one or more computer networks 204. Further, although shown as part of the system, it should be understood that any one or more of the subsystems may function or operate as a separate system without regard to any of the other subsystems. It should also be understood that the system may include one or more additional or alternative subsystems than those shown in FIG. 2A.

As shown, in some examples, the system 200 includes an onboard computer 206 that may correspond to onboard component/computer 120. The onboard computer includes an onboard reasoner 208, and in some examples, the onboard computer is configured to diagnose a failure on the aircraft that includes aircraft systems configured to report faults to the onboard reasoner. At least when the aircraft 202 corresponds to aircraft 100, examples of suitable aircraft systems include propulsion system 110, electrical system 114, hydraulic system 116 and/or environmental system 118. Any number of other systems may be included.

In some examples, the onboard computer 206 is configured to receive a fault report from an aircraft system of the aircraft systems, the fault report indicating failed tests reported by the aircraft system. The onboard computer is configured to access, by the onboard reasoner 208, an onboard diagnostic causal model, which may be represented by a graph that describes known causal relationships between possible failed tests reported by the respective ones of the aircraft systems, and possible failure modes of the respective ones of the aircraft systems. In some more particular examples, the onboard diagnostic causal model is represented by the graph that includes nodes connected by edges, in which the nodes represent the possible failed tests and the possible failure modes, and the edges indicate the known causal relationships between the possible failed tests and the possible failure modes. Additionally or alternatively, in some examples, the onboard diagnostic causal model is represented by the graph that is an assembly of graphs for respective ones of the aircraft systems, in which the graphs reflect fault propagation behavior within the respective ones of the aircraft systems, and the assembly reflects fault propagation behavior across connected ones of the aircraft systems.

Figure 2B:
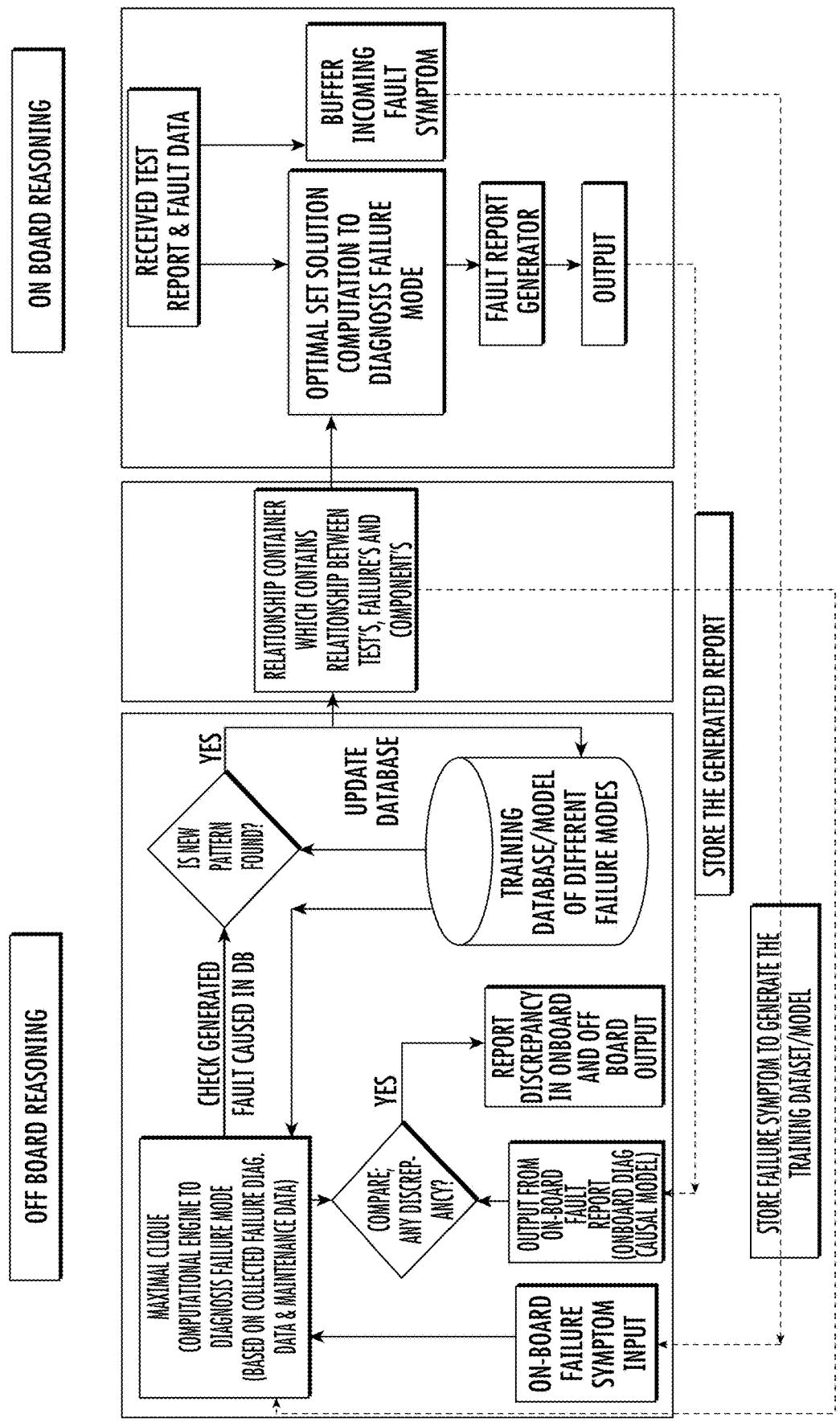
FIG. 2B illustrates a block diagram of an onboard computer with an onboard reasoner functionally connected to an off-board computer with an off-board reasoner, according to example implementations of the present disclosure.

With reference to FIG. 2B, the onboard computer includes an onboard reasoner 208, with which the onboard computer is configured to diagnose a failure on the aircraft that includes aircraft systems configured to report faults to the onboard reasoner. The onboard computer 206 is configured to diagnose, by the onboard reasoner 208, a failure mode of the aircraft system or another of the aircraft systems, from the failed tests, and using the onboard diagnostic causal model 210 and a graph-theoretic algorithm such as an optimal solution set (OSS) algorithm. The onboard computer is also configured to generate a failure report associated with the diagnosed failure mode, based on which a maintenance message may be generated that indicates a maintenance action. As shown in FIG. 2B, an off-board computer 218 is configured to maintain the onboard reasoner 208. In some examples, the off-board computer is configured to access diagnostic data received directly or indirectly from the onboard computer. This diagnostic data includes a plurality of fault reports of failed tests reported by respective ones of the aircraft systems, and a plurality of diagnosed failure modes of at least some of the aircraft systems that caused the failed tests. The off-board computer 218 includes an off-board reasoner 224, which is configured to determine causal relationships between the failed tests and the plurality of diagnosed failure modes. The off-board diagnostic causal model uses a machine learning algorithm trained using historical diagnostic data, which may be a machine learning algorithm such as a graph-theoretic algorithm for finding maximal cliques such as a Bron-Kerbosch algorithm. The machine learning algorithm for finding maximal cliques uses diagnostic data, including historical data that relates maintenance actions to maintenance messages or failure modes (obtained from a database of actual aircraft diagnostic data, which includes different failure modes; relationships between test reports, failure reports and components; maintenance action data, etc.), for determining known causal relationships between failure modes and failed tests. The off-board reasoner employing the machine learning algorithm is configured to use actual failure data, diagnostic data and/or maintenance action data received from an onboard aircraft system (from which to determine relationships between failure modes and failed tests), which is compared to the diagnostic data accessible from the aircraft onboard diagnostic system (onboard computer 206). The off-board reasoner may determine a discrepancy based on the comparison, which may then update and improve the onboard diagnostic causal model. The identification of a discrepancy may comprise identifying a new maintenance action, from historical diagnostic data and maintenance action data collected from an aircraft onboard system, wherein the discrepancy identification identifies a new maintenance action that is associated with the failure mode.

Figure 3:
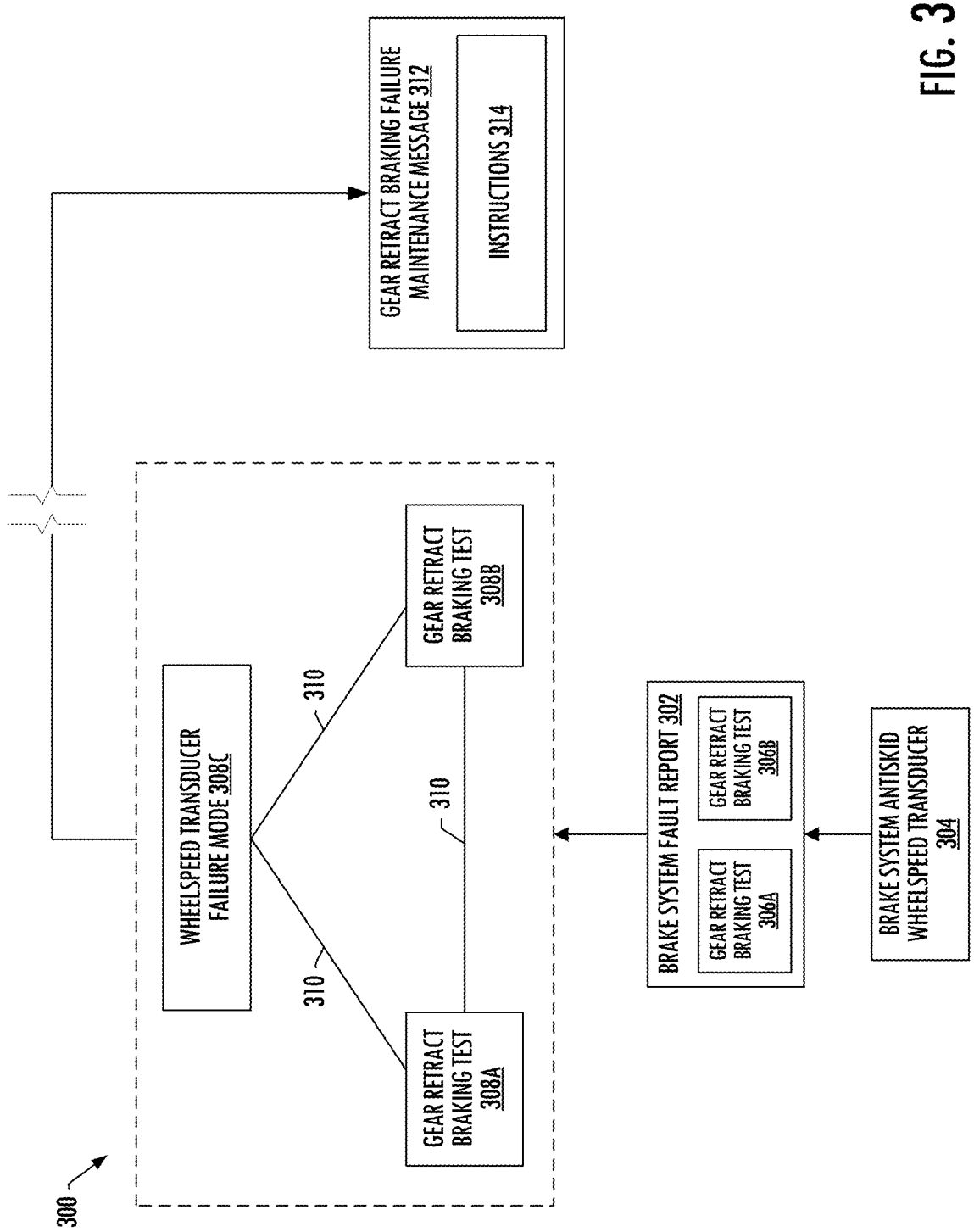
FIG. 3 illustrates a graph-based representation of an onboard diagnostic causal model, according to example implementations of the present disclosure.

FIG. 3 shows an example graph-based representation of an onboard diagnostic causal model 300 suitable as the onboard diagnostic casual model 210, according to some example implementations. As shown, a fault report 302 from an aircraft brake system antiskid wheelspeed transducer 304 may indicate failed gear retract braking tests 306A, 306B. As also shown, the onboard diagnostic casual model may include nodes 308A-C connected by edges 310. The nodes may include nodes 308A, 308B that represent the failed gear retract braking tests, and a node 308C that represents a failure mode with a known causal relationship to the failed tests, as indicated by the edges connecting the nodes. In this regard, the failed tests share a common failure mode of a spurious operation of the aircraft brake system antiskid wheel speed transducer. This failure mode, then, may be diagnosed from the failed tests and using the onboard causal model. A maintenance action may be implemented for the failure mode, and a maintenance message 312 that references instructions 314 for performing the maintenance action may be generated. Such maintenance action data may be collected from the aircraft condition monitoring system or other system as historical maintenance action data and/or diagnostic data, where actual historic diagnostic data and maintenance action data may be used in determining actual causal relationships.

Returning to FIG. 2A, the onboard computer 206 is configured to diagnose, by the onboard reasoner 208, a failure mode of the aircraft system or another of the aircraft systems, from the failed tests, and using a graph-theoretic algorithm and the onboard diagnostic causal model 210. One example of a suitable graph-theoretic algorithm is an optimal solution set (OSS) algorithm. The OSS algorithm may utilize submodular minimization of data to provide an efficient distributed optimization algorithm, where data on various failed test reports may be associated to an element or category of test reports or failure modes, and only data of subsets containing a specific failed test report or failure mode itself is considered while ignoring all other data. The optimization algorithm may further create graphs of nodes for graph-theoretic analysis, and may use neighboring node and/or edge probability analysis to determine a diagnosed failure mode, which would describe a diagnosis causal relationship between failed tests reported by the aircraft and possible failure modes for a reported aircraft system. The onboard computer is also configured to determine a maintenance action for the failure mode and generate a maintenance message 212 including at least the maintenance action.

In some examples, the onboard computer 206 is further configured to send the maintenance message 212 to a display device 214 onboard the aircraft, or to a display device on a maintenance component configured to establish a connection with the onboard computer to receive and display the maintenance message 212. In some of these examples, display of the maintenance message references instructions 216 for performing the maintenance action to address the failure mode diagnosed by the onboard reasoner 208.

As also shown in FIG. 2A, the system 200 in some examples includes an off-board computer 218 configured to maintain the onboard reasoner 208. In some examples, the off-board computer is configured to access diagnostic data received directly or indirectly from the onboard computer. This diagnostic data includes a plurality of fault reports of failed tests reported by respective ones of the aircraft systems, and a plurality of diagnosed failure modes of at least some of the aircraft systems that caused the failed tests.

As shown, in some examples, the system 200 includes at least one source 220 of data. In some examples, the source includes a memory that may be located at a single source or distributed across multiple sources. The data may be stored in a number of different manners, such as in a database or flat files of any of a number of different types or formats. In some of these examples, an aircraft condition monitoring system (ACMS) onboard the aircraft 202 may collect, monitor, record, and report diagnostic data. At least some of the diagnostic data may be accessible from reports generated by the ACMS and may be wirelessly transmitted to a particular source of data—shown and at times referred to as an airplane health management (AHM) system 220A—directly or via an artificial satellite 222 or network(s) 204. In other of these examples, the diagnostic data may be transmitted via a wired connection or portable data storage device (e.g., flash memory, thumb drive).

In some examples, the off-board computer 218 includes an off-board reasoner 224. The off-board computer is configured to build, using the off-board reasoner, an off-board diagnostic causal model 226, which may be that describes causal relationships between the failed tests and the plurality of diagnosed failure modes. The off-board diagnostic causal model is here built using a graph-theoretic machine learning algorithm trained using historical diagnostic data. And in some examples, the off-board diagnostic causal model is represented by the graph that includes nodes connected by edges, in which the nodes representing the failed tests and the plurality of diagnosed failure modes, and the edges indicating the known causal relationships between the failed tests and the plurality of diagnosed failure modes. The offboard diagnostic causal model 226 employs a machine learning algorithm that uses failure data, historical diagnostic data and/or maintenance action data received from an onboard aircraft system. which is compared to diagnostic data accessible from the aircraft onboard diagnostic system (onboard computer 206). The off-board diagnostic causal model 226 may determine a discrepancy based its comparison to the diagnostic data. In the example onboard diagnostic causal model in FIG. 3, a graph-based representation of a fault report 302 from an aircraft brake system antiskid wheelspeed transducer 304 indicates failed gear retract braking tests 306A, 306B. The off-board diagnostic causal model 226 can identify a discrepancy based on collected maintenance action data such as a wheel speed transducer repair instruction (MM_32_30710), for defining a new relationship in the diagnostic causal model pertaining to the fault, to be incorporated into the aircraft's onboard diagnostic reasoner model.

Figure 4:
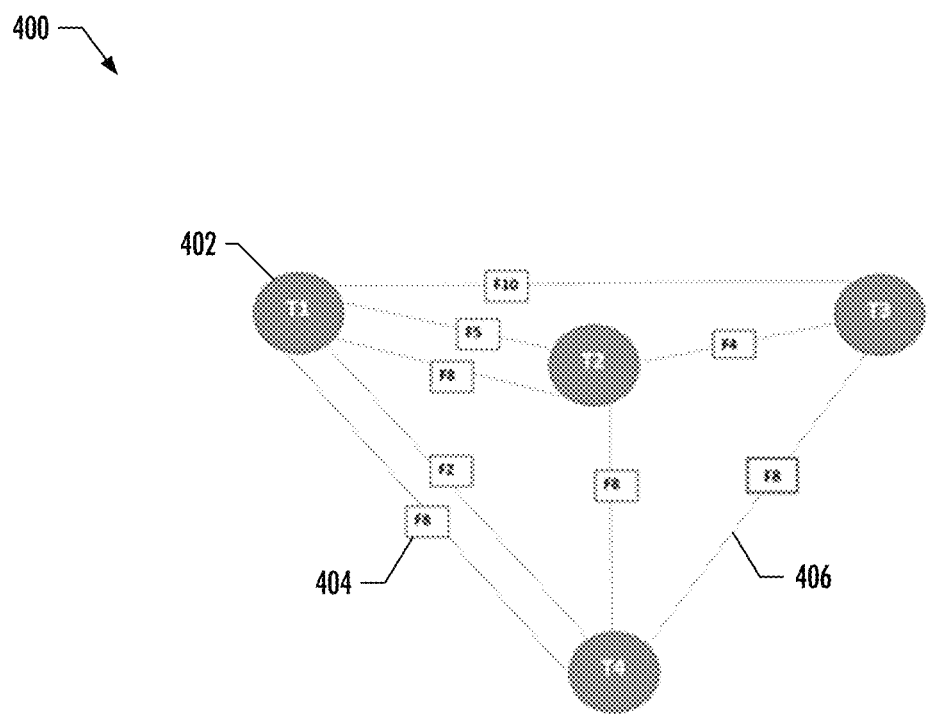
FIG. 4 illustrates a sub-graph representing a maximal clique, according to example implementations.

One example of a suitable graph-theoretic machine learning algorithm is a graph-theoretic algorithm for finding maximal cliques such as a Bron-Kerbosch algorithm. A graph-theoretic machine learning algorithm for finding maximal cliques may use diagnostic data to determine known causal relationships between failure modes and failed tests. FIG. 4 shows diagnostic data and relationships may be transposed into a graph of a maximal clique 400 with nodes 402, 404, and edges 406 as described below, one of each being called out in the figure. Here, the nodes 402 represent possible failed tests T1, T2, T3, and T4, and the nodes 404 represent possible failure modes F2, F4, F5, F8, and F10. The edges indicate known causal relationships between the possible failed tests and the possible failure modes.

The maximal clique 400 can be determined from the graph, which in this example includes all of the nodes 402, 404 and edges 406 in the graph based on the diagnostic data. In other examples a maximal clique may include less than all of the nodes and edges. From the maximal clique, particular failure modes associated with failed tests may be isolated.

For example, the edges 406 may be examined to find the active failure mode(s) 404 associated with the reported failed tests at the nodes 402. The off-board reasoner 224 may determine that a clique is a maximal clique (e.g., maximal clique 400) if it has more than one node for a failed test. Further, the maximal clique may be identified as a monochromatic clique if all of the nodes for the failed tests have one or more shared failure mode as determined from the edges connecting the nodes. A shared failure mode(s) becomes the failure mode of interest, and the monochromatic clique may then be used to identify the failed component associated with the failure mode of interest. In FIG. 4, maximal clique 400 is a monochromatic clique with a shared failure mode F8 as identified from edges 404 connecting the nodes 402 representing the failed tests with the nodes 404 representing the shared failure mode F8.

Returning again to FIG. 2A, the off-board diagnostic causal model 226 may be matured by discovering any new relationships between failure modes and failed tests that were not present in the onboard diagnostic causal model 210 or are the result of emergent behavior in any of the aircraft systems. This can be mined from historical data that relates maintenance actions to maintenance messages 212 or failure modes, which may then update and improve the off-board diagnostic causal model.

The off-board diagnostic causal model 226 may have a certain signature that defines the expected propagation of the failure modes. In operation, the off-board reasoner 224 may record the portions of the signature that it encounters while performing diagnosis. The off-board diagnostic causal model can be improved from this historical data (using a historical signature), which can be compared to a previous off-board diagnostic causal model so that any new relationship can be considered for addition to an updated off-board diagnostic causal model.

The off-board computer 218 is configured to compare the diagnostic data from the onboard computer 206 to the off-board diagnostic causal model 226 to diagnose failure modes of the aircraft systems. In this regard, the diagnostic data may describe known causal relationships between possible failed tests reported by the respective ones of the aircraft systems, and possible failure modes of the respective ones of the aircraft systems.

Based on the above, in these examples, the off-board computer 218 is configured to determine a new causal relationship in the causal relationships described by the off-board diagnostic causal model 226 that is new relative to the known causal relationships. The off-board computer is also configured to update the onboard diagnostic causal model to further describe the new causal relationship. This includes the off-board computer configured to produce an updated onboard diagnostic causal model, and upload the updated onboard diagnostic causal model to the onboard computer 206 as a loadable software airplane part (LSAP) via an LSAP upload tool set 228.

In some examples, the plurality of fault reports include a fault report that indicates those of the failed tests caused by a diagnosed failure mode of the plurality of diagnosed failure modes. In some of these examples, the off-board computer 218 is further configured to diagnose, by the off-board reasoner 224, a corresponding failure mode of the aircraft system, from those of the failed tests caused by the diagnosed failure mode, and using the graph-theoretic machine learning algorithm and the graph. The off-board computer, then, is also configured to report any discrepancy between the corresponding failure mode diagnosed by the off-board reasoner, and the diagnosed failure mode of the plurality of diagnosed failure modes from the diagnostic data received from the onboard computer 206.

In some examples, the diagnostic data accessed by the off-board computer 218 further includes maintenance messages 212 with maintenance actions determined by the onboard reasoner 208 for respective ones of the plurality of diagnosed failure modes. In some of these examples, the onboard diagnostic causal model 210 further describes relationships between the possible failure modes and respective ones of the maintenance actions. For a particular maintenance message with a particular maintenance action for a respective diagnosed failure mode, then, the off-board computer 218 is further configured to access a maintenance record with a performed maintenance action and thereby a new maintenance action for the respective diagnosed failure mode. The off-board computer is also configured to identify a maintenance action discrepancy between the particular maintenance action and the performed maintenance action, to determine a new relationship between the respective diagnosed failure mode and the performed maintenance action. The new relationship may be a new maintenance action, which is identified from historical diagnostic data and maintenance action data collected from an aircraft, where the new maintenance action is associated with the failure mode. And the off-board computer is configured to update the onboard diagnostic causal model to describe the new relationship between the respective diagnosed failure mode and the performed maintenance action. For example, the updated onboard diagnostic causal model may further include the new maintenance action that is identified from collected historical maintenance action data, which is associated with the failure mode.

FIGS. 5A, 5B, and 5C are flowcharts illustrating various steps in a method 500 of diagnosing a failure on an aircraft 202 that includes aircraft systems configured to report faults to an onboard reasoner 208, according to example implementations of the present disclosure.

As shown in FIG. 5A, at block 502, the method 500 includes receiving a fault report at an onboard computer 206 of the aircraft 202 that includes the onboard reasoner 208, from an aircraft system of the aircraft systems, the fault report indicating failed tests reported by the aircraft system. As shown at block 504, the method includes accessing, by the onboard reasoner, an onboard diagnostic causal model 210 represented by a graph that describes known causal relationships between possible failed tests reported by the respective ones of the aircraft systems, and possible failure modes of the respective ones of the aircraft systems.

As shown at block 506, the method includes diagnosing, by the onboard reasoner 208, a failure mode of the aircraft system or another of the aircraft systems, from the failed tests, and using a graph-theoretic algorithm (e.g., an OSS algorithm) and the onboard diagnostic causal model 210. As shown at block 508, the method includes determining a maintenance action for the failure mode. And as shown at block 510, the method includes generating, by the onboard computer 206, a maintenance message 212 including at least the maintenance action.

In some examples, the method 500 further includes sending the maintenance message 212 to a display device 214 onboard the aircraft 202, or a display device on a maintenance component configured to establish a connection with the onboard computer to receive the maintenance message, as shown at block 512.

As shown in FIG. 5B, in some examples the fault report is one of a plurality of fault reports of failed tests reported by respective ones of the aircraft systems, and the failure mode is one of a plurality of diagnosed failure modes of at least some of the aircraft systems that caused the failed tests. As shown at block 514, the method 500 further includes accessing diagnostic data received from the onboard computer 206, and the diagnostic data includes the plurality of fault reports and the plurality of diagnosed failure modes.

As shown at block 516, the method 500 further includes accessing, by the off-board reasoner 224, the off-board diagnostic causal model 226 describing causal relationships between the failed tests and the plurality of diagnosed failure modes. The off-board diagnostic causal model is built using a graph-theoretic machine learning algorithm trained using historical diagnostic data. The method further includes comparing the diagnostic data to the off-board diagnostic causal model, as shown at block 518.

Based on the comparison at block 518, the method 500 further includes identifying a discrepancy between the diagnostic data and the off-board diagnostic causal model 226, to determine a new causal relationship in the causal relationships described by the off-board diagnostic causal model 226 that is new relative to the known causal relationships, as shown at block 520. As shown at block 522, the method further includes updating the onboard diagnostic causal model to further describe the new causal relationship, including producing an updated onboard diagnostic causal model, and uploading the updated onboard diagnostic causal model to the onboard component using the LSAP upload tool set 228.

As shown in FIG. 5C, in some examples, the diagnostic data further includes maintenance messages 212 with maintenance actions determined by the onboard reasoner 208 for respective ones of the plurality of diagnosed failure modes, and the onboard diagnostic causal model 210 further describes relationships between the possible failure modes and respective ones of the maintenance actions. For a particular maintenance message with a particular maintenance action for a respective diagnosed failure mode, the method 500 further includes accessing a maintenance record with a performed maintenance action and thereby a new maintenance action for the respective diagnosed failure mode, as shown at block 524. As shown at block 526, the method further includes identifying a maintenance action discrepancy between the particular maintenance action and the performed maintenance action to determine a new relationship between the respective diagnosed failure mode and the performed maintenance action. The step of identifying a maintenance action discrepancy may also include identifying a new maintenance action from historical diagnostic data and maintenance action data collected from an aircraft condition monitoring system, wherein the discrepancy identification identifies a new maintenance action that is associated with the failure mode. Then updating the onboard diagnostic causal model further includes updating the onboard diagnostic causal model to describe the new relationship between the respective diagnosed failure mode and the performed maintenance action, as shown at block 522A.

FIGS. 6A, 6B, and 6C are flowcharts illustrating various steps in a method 600 of maintaining the onboard reasoner 208 for diagnosing failures on the aircraft 202 that includes aircraft systems configured to report faults to the onboard reasoner. As shown in FIG. 6A, at block 602, the method includes accessing diagnostic data received from the onboard computer 206 of the aircraft that includes the onboard reasoner, the diagnostic data including a plurality of fault reports of failed tests reported by respective ones of the aircraft systems, and a plurality of diagnosed failure modes of at least some of the aircraft systems that caused the failed tests.

As shown at block 604, the method 600 includes building, using an off-board reasoner 224, an off-board diagnostic causal model 226 that describes causal relationships between the failed tests and the plurality of diagnosed failure modes. The off-board diagnostic causal model is built using a graph-theoretic machine learning algorithm trained using historical diagnostic data.

As shown at block 606, the method 600 includes comparing the diagnostic data to the off-board diagnostic causal model 226. Based on the comparison at block 606, the method 600 includes determining a new causal relationship in the causal relationships described by the off-board diagnostic causal model 226 that is new relative to the known causal relationships, as shown at block 608. As shown at block 610, the method includes updating the onboard diagnostic causal model to further describe the new causal relationship, including producing an updated onboard diagnostic causal model, and uploading the updated onboard diagnostic causal model to the onboard computer using the LSAP upload tool set 228.

In some examples, the plurality of fault reports include a fault report that indicates those of the failed tests caused by a diagnosed failure mode of the plurality of diagnosed failure modes, and as shown in FIG. 6B, at block 612, the method 600 further includes diagnosing, by the off-board reasoner 224, a corresponding failure mode of the aircraft system from those of the failed tests caused by the diagnosed failure mode, and using the graph-theoretic machine learning algorithm and the graph. As shown at block 614, the method further includes reporting any discrepancy between the corresponding failure mode diagnosed by the off-board reasoner and the diagnosed failure mode of the plurality of diagnosed failure modes from the diagnostic data received from the onboard computer 206.

In some examples, the diagnostic data further includes maintenance messages 212 with maintenance actions determined by the onboard reasoner 208 for respective ones of the plurality of diagnosed failure modes, and the onboard diagnostic causal model 210 further describes relationships between the possible failure modes and respective ones of the maintenance actions. For a particular maintenance message with a particular maintenance action for a respective diagnosed failure mode, as shown in FIG. 6C, the method 600 further includes accessing a maintenance record with a performed maintenance action and thereby a new maintenance action for the respective diagnosed failure mode, as shown at block 616. The method further includes identifying a maintenance action discrepancy between the particular maintenance action and the performed maintenance action, to determine a new relationship between the respective diagnosed failure mode and the performed maintenance action, as shown at block 618. Then, updating the onboard diagnostic causal model further includes updating the onboard diagnostic causal model to describe the new relationship between the respective diagnosed failure mode and the performed maintenance action, as shown at block 610A.

In some examples, the method 600 may tie into method 500 in which the updated onboard diagnostic casual model may be used to diagnose a failure mode of an aircraft system. This may include receiving a fault report at the onboard computer 206 of the aircraft 202 that includes the onboard reasoner 208 (see block 502). The onboard reasoner may access the updated onboard diagnostic causal model 210, and diagnose a failure mode of the aircraft system or another of the aircraft systems, from the failed tests, and using a graph-theoretic algorithm and the updated onboard diagnostic causal model (see blocks 504 and 506). A maintenance action for the failure mode may be determined, a maintenance message 212 including at least the maintenance action may be generated (see blocks 508 and 510).

According to example implementations of the present disclosure, the system 200 and its subsystems may be implemented by various means. Means for implementing the system and its subsystems may include hardware, alone or under direction of one or more computer programs from a computer-readable storage medium. In some examples, one or more apparatuses may be configured to function as or otherwise implement the system and its subsystems shown and described herein. In examples involving more than one apparatus, the respective apparatuses may be connected to or otherwise in communication with one another in a number of different manners, such as directly or indirectly via a wired or wireless network 514 or the like.

FIG. 7 illustrates an apparatus 700 that in various example implementations may be configured to implement the onboard computer 206 and/or the off-board computer 218 shown in FIG. 2A. Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, processing circuitry 702 (e.g., processor unit) connected to a memory 704 (e.g., storage device).

The processing circuitry 702 may be composed of one or more processors alone or in combination with one or more memories. The processing circuitry is generally any piece of computer hardware that is capable of processing information such as, for example, data, computer programs and/or other suitable electronic information. The processing circuitry is composed of a collection of electronic circuits some of which may be packaged as an integrated circuit or multiple interconnected integrated circuits (an integrated circuit at times more commonly referred to as a "chip"). The processing circuitry may be configured to execute computer programs, which may be stored onboard the processing circuitry or otherwise stored in the memory 704 (of the same or another apparatus).

The processing circuitry 702 may be a number of processors, a multi-core processor or some other type of processor, depending on the particular implementation. Further, the processing circuitry may be implemented using a number of heterogeneous processor systems in which a main processor is present with one or more secondary processors on a single chip. As another illustrative example, the processing circuitry may be a symmetric multi-processor system containing multiple processors of the same type. In yet another example, the processing circuitry may be embodied as or otherwise include one or more ASICs, FPGAs or the like. Thus, although the processing circuitry may be capable of executing a computer program to perform one or more functions, the processing circuitry of various examples may be capable of performing one or more functions without the aid of a computer program. In either instance, the processing circuitry may be appropriately programmed to perform functions or operations according to example implementations of the present disclosure.

The memory 704 is generally any piece of computer hardware that is capable of storing information such as, for example, data, computer programs (e.g., computer-readable program code 706) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 704, the processing circuitry 702 may also be connected to one or more interfaces for displaying, transmitting and/or receiving information. The interfaces may include a communications interface 708 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 710 and/or one or more user input interfaces 712 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processing circuitry that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processing circuitry or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processing circuitry or other programmable apparatus to configure the computer, processing circuitry or other programmable apparatus to execute operations to be performed on or by the computer, processing circuitry or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processing circuitry or other programmable apparatus provide operations for implementing functions described herein.

Execution of instructions by a processing circuitry, or storage of instructions in a computer-readable storage medium, supports combinations of operations for performing the specified functions. In this manner, an apparatus 700 may include a processing circuitry 702 and a computer-readable storage medium or memory 704 coupled to the processing circuitry, where the processing circuitry is configured to execute computer-readable program code 706 stored in the memory. It will also be understood that one or more functions, and combinations of functions, may be implemented by special purpose hardware-based computer systems and/or processing circuitry which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An off-board computer for maintaining an onboard reasoner for diagnosing failures on an aircraft that includes aircraft systems configured to report faults to the onboard reasoner, the off-board computer comprising:
   memory configured to store computer-readable program code including an off-board reasoner; and
   processing circuitry configured to access the memory and execute the computer-readable program code to cause the off-board computer to at least:
   access diagnostic data received from an onboard computer of the aircraft that includes the onboard reasoner, the diagnostic data including a plurality of fault reports of failed tests reported by respective ones of the aircraft systems, and a plurality of diagnosed failure modes of at least some of the aircraft systems that caused the failed tests;
   build, using the off-board reasoner, an off-board diagnostic causal model that describes causal relationships between the failed tests and the plurality of diagnosed failure modes, the off-board diagnostic causal model built using a theoretic machine learning algorithm trained using historical diagnostic data;
   compare the diagnostic data to the off-board diagnostic causal model; and based thereon,
   determine a new causal relationship in the causal relationships described by the off-board diagnostic causal model that is new relative to known causal relationships; and
   update an onboard diagnostic causal model to further describe the new causal relationship, including the off-board computer caused to produce an updated onboard diagnostic causal model, and upload the updated onboard diagnostic causal model to the onboard computer using a loadable software airplane part upload tool set;
   wherein the plurality of fault reports include a fault report that indicates those of the failed tests caused by a diagnosed failure mode of the plurality of diagnosed failure modes, and the off-board computer is further caused to:
   diagnose, by the off-board reasoner, a corresponding failure mode of at least one of the aircraft systems, from those of the failed tests caused by the diagnosed failure mode, and using the theoretic machine learning algorithm and a graph; and
   report any discrepancy between the corresponding failure mode and the diagnosed failure mode of the plurality of diagnosed failure modes from the diagnostic data received from the onboard computer.

2. The off-board computer of claim 1, wherein the off-board diagnostic causal model is represented by the graph that includes nodes connected by edges, the nodes representing the failed tests and the plurality of diagnosed failure modes, and the edges indicating the known causal relationships between the failed tests and the plurality of diagnosed failure modes.

3. The off-board computer of claim 1, wherein the theoretic machine learning algorithm is a graph-theoretic algorithm for finding maximal cliques.

4. The off-board computer of claim 1, wherein the diagnostic data further includes maintenance messages with maintenance actions determined by the onboard reasoner for respective ones of the plurality of diagnosed failure modes, and the onboard diagnostic causal model further describes relationships between possible failure modes and respective ones of the maintenance actions,
   wherein for a particular maintenance message with a particular maintenance action for a respective diagnosed failure mode, the processing circuitry is configured to execute the computer-readable program code to cause the off-board computer to further at least:
   access a maintenance record with a performed maintenance action for the respective diagnosed failure mode; and
   identify a maintenance action discrepancy between the particular maintenance action and the performed maintenance action, to determine a new relationship between the respective diagnosed failure mode and the performed maintenance action, and
   wherein the off-board computer caused to update the onboard diagnostic causal model further includes the off-board computer caused to update the onboard diagnostic causal model to describe the new relationship between the respective diagnosed failure mode and the performed maintenance action.

5. A method of maintaining an onboard reasoner for diagnosing failures on an aircraft that includes aircraft systems configured to report faults to the onboard reasoner, the method comprising:
   accessing diagnostic data received from an onboard computer of the aircraft that includes the onboard reasoner, the diagnostic data including a plurality of fault reports of failed tests reported by respective ones of the aircraft systems, and a plurality of diagnosed failure modes of at least some of the aircraft systems that caused the failed tests;
   building, using an off-board reasoner, an off-board diagnostic causal model that describes causal relationships between the failed tests and the plurality of diagnosed failure modes, the off-board diagnostic causal model built using a theoretic machine learning algorithm trained using historical diagnostic data;
   comparing the diagnostic data to the off-board diagnostic causal model; and based thereon,
   determining a new causal relationship in the causal relationships described by the off-board diagnostic causal model that is new relative to known causal relationships; and
   updating an onboard diagnostic causal model to further describe the new causal relationship, including producing an updated onboard diagnostic causal model, and uploading the updated onboard diagnostic causal model to the onboard computer using a loadable software airplane part upload tool set;
   wherein the comparing of the diagnostic data to the off-board diagnostic causal model further comprises comparing to actual failure data, diagnostic data, and maintenance action data collected from an onboard aircraft system, which reflect actual causal relationships.

6. The method of claim 5, wherein the off-board diagnostic causal model is represented by a graph that includes nodes connected by edges, the nodes representing the failed tests and the plurality of diagnosed failure modes, and the edges indicating the known causal relationships between the failed tests and the plurality of diagnosed failure modes.

7. The method of claim 5, wherein the theoretic machine learning algorithm is a graph-theoretic algorithm for finding maximal cliques.

8. The method of claim 5, wherein the plurality of fault reports include a fault report that indicates those of the failed tests caused by a diagnosed failure mode of the plurality of diagnosed failure modes, and the method further comprises:
   diagnosing, by the off-board reasoner, a corresponding failure mode of at least one of the aircraft systems, from those of the failed tests caused by the diagnosed failure mode, and using the theoretic machine learning algorithm and a graph; and
   reporting any reporting any discrepancy between the corresponding failure mode and the diagnosed failure mode of the plurality of diagnosed failure modes from the diagnostic data received from the onboard computer.

9. The method of claim 5, wherein the diagnostic data further includes maintenance messages with maintenance actions determined by the onboard reasoner for respective ones of the plurality of diagnosed failure modes, and the onboard diagnostic causal model further describes relationships between possible failure modes and respective ones of the maintenance actions, and
   wherein for a particular maintenance message with a particular maintenance action for a respective diagnosed failure mode, the method further comprises:
   accessing a maintenance record with a performed maintenance action for the respective diagnosed failure mode; and
   identifying a maintenance action discrepancy between the particular maintenance action and the performed maintenance action, to determine a new relationship between the respective diagnosed failure mode and the performed maintenance action,
   wherein updating the onboard diagnostic causal model further includes updating the onboard diagnostic causal model to describe the new relationship between the respective diagnosed failure mode and the performed maintenance action.

10. The method of claim 5 further comprising:
    receiving a fault report at the onboard computer of the aircraft that includes the onboard reasoner, from an aircraft system of the aircraft systems, the fault report indicating failed tests reported by the aircraft system;
    accessing, by the onboard reasoner, the updated onboard diagnostic causal model;
    diagnosing, by the onboard reasoner, a failure mode of the aircraft system or another of the aircraft systems, from the failed tests, and using a graph-theoretic algorithm and the updated onboard diagnostic causal model;
    determining a maintenance action for the failure mode; and
    generating, by the onboard computer, a maintenance message including at least the maintenance action.

11. The method of claim 10, wherein the graph-theoretic algorithm is an optimal solution set (OSS) algorithm.

12. A system for maintaining an onboard reasoner for diagnosing failures on an aircraft that includes aircraft systems configured to report faults to the onboard reasoner, the system comprising:
    an onboard computer including the onboard reasoner, the onboard computer configured to send diagnostic data including a plurality of fault reports of failed tests reported by respective ones of the aircraft systems, and a plurality of diagnosed failure modes of at least some of the aircraft systems that caused the failed tests; and an off-board computer including an off-board reasoner, the off-board computer configured to:

access the diagnostic data received from the onboard computer;

build an off-board diagnostic causal model that describes causal relationships between the failed tests and the plurality of diagnosed failure modes, the off-board diagnostic causal model built using a theoretic machine learning algorithm trained using historical diagnostic data, wherein the theoretic machine learning algorithm is a graph-theoretic algorithm for finding maximal cliques;

compare the diagnostic data to the off-board diagnostic causal model; and based thereon, determine a new causal relationship in the causal relationships described by the off-board diagnostic causal model that is new relative to known causal relationships; and update an onboard diagnostic causal model to further describe the new causal relationship, including the off-board computer configured to produce an updated onboard diagnostic causal model, and upload the updated onboard diagnostic causal model to the onboard computer using a loadable software airplane part upload tool set.

13. The system of claim 12, wherein the off-board diagnostic causal model is represented by a graph that includes nodes connected by edges, the nodes representing the failed tests and the plurality of diagnosed failure modes, and the edges indicating the known causal relationships between the failed tests and the plurality of diagnosed failure modes.

14. The system of claim 12, wherein the comparison of the diagnostic data to the off-board diagnostic causal model further comprises comparison to actual failure data, diagnostic data, and maintenance action data collected from an onboard aircraft system, which reflect actual causal relationships.

15. The system of claim 12, wherein the plurality of fault reports include a fault report that indicates those of the failed tests caused by a diagnosed failure mode of the plurality of diagnosed failure modes, and the off-board computer is further configured to:

diagnose, by the off-board reasoner, a corresponding failure mode of at least one of the aircraft systems, from those of the failed tests caused by the diagnosed failure mode, and using the theoretic machine learning algorithm and a graph; and report any discrepancy between the corresponding failure mode and the diagnosed failure mode of the plurality of diagnosed failure modes from the diagnostic data received from the onboard computer.

16. The system of claim 12, wherein the diagnostic data further includes maintenance messages with maintenance actions determined by the onboard reasoner for respective ones of the plurality of diagnosed failure modes, and the onboard diagnostic causal model further describes relationships between possible failure modes and respective ones of the maintenance actions, wherein for a particular maintenance message with a particular maintenance action for a respective diagnosed failure mode, the off-board computer is configured to:

access a maintenance record with a performed maintenance action for the respective diagnosed failure mode; and identify a maintenance action discrepancy between the particular maintenance action and the performed maintenance action, to determine a new relationship between the respective diagnosed failure mode and the performed maintenance action, and wherein the off-board computer configured to update the onboard diagnostic causal model further includes the off-board computer configured to update the onboard diagnostic causal model to describe the new relationship between the respective diagnosed failure mode and the performed maintenance action.

17. The system of claim 12, wherein the onboard computer is further configured to:

receive a fault report of the aircraft, from an aircraft system of the aircraft systems, the fault report indicating failed tests reported by the aircraft system;

access, by the onboard reasoner, the updated onboard diagnostic causal model;

diagnose, by the onboard reasoner, a failure mode of the aircraft system or another of the aircraft systems, from the failed tests, and using the graph-theoretic algorithm and the updated onboard diagnostic causal model;

determine a maintenance action for the failure mode; and generate a maintenance message including at least the maintenance action.

18. The system of claim 17, wherein the graph-theoretic algorithm is an optimal solution set (OSS) algorithm.

* * * * *